(12) United States Patent
Sartschev et al.

(10) Patent No.: US 11,514,958 B2
(45) Date of Patent: Nov. 29, 2022

(54) APPARATUS AND METHOD FOR OPERATING SOURCE SYNCHRONOUS DEVICES

(71) Applicant: Teradyne, Inc., North Reading, MA (US)

(72) Inventors: Ronald A. Sartschev, Andover, MA (US); Jan Paul Anthonie van der Wagt, Carlsbad, CA (US); Nathan Nary, Thousand Oaks, CA (US); Grady Borders, West Hills, CA (US)

(73) Assignee: Teradyne, Inc., North Reading, MA (US)

( * ) Notice: Subject to any disclaimer, the term of this patent is extended or adjusted under 35 U.S.C. 154(b) by 297 days.

(21) Appl. No.: 16/989,767

(22) Filed: Aug. 10, 2020

(65) Prior Publication Data

US 2022/0044715 A1 Feb. 10, 2022

(51) Int. Cl.
*G11C 7/22* (2006.01)

(52) U.S. Cl.
CPC .................................. *G11C 7/222* (2013.01)

(58) Field of Classification Search
CPC . G11C 7/222; G11C 29/023; G11C 29/50012; G11C 29/56012
See application file for complete search history.

(56) References Cited

U.S. PATENT DOCUMENTS

| | | | |
|---|---|---|---|
| 7,593,497 B2 | 9/2009 | Conner | |
| 8,542,003 B2* | 9/2013 | Uetmatsu | G11C 29/56012 324/76.35 |
| 9,166,596 B2* | 10/2015 | Chong | G11C 7/1066 |
| 9,503,065 B1* | 11/2016 | van der Wagt | H03K 5/14 |
| 9,536,589 B2* | 1/2017 | Zerbe | G11C 7/22 |
| 9,542,512 B1 | 1/2017 | Al-Hawari et al. | |
| 10,276,229 B2 | 4/2019 | van der Wagt | |
| 10,891,996 B1* | 1/2021 | Purohit | G11C 7/222 |
| 2007/0098127 A1 | 5/2007 | Conner | |
| 2018/0294802 A1 | 10/2018 | Swanson et al. | |
| 2020/0051610 A1 | 2/2020 | Zerbe et al. | |

FOREIGN PATENT DOCUMENTS

JP 5202456 B2 6/2013

OTHER PUBLICATIONS

[No Author Listed], TN-46-07 DDR333 Memory Design Guide for Two-DIMM Unbuffered Systems. Micron Technology, Inc. 2002. 21 pages.
[No Author Listed], TN-41-08: Design Guide for Two DDR3-1066 UDIMM Systems. Micron Technology, Inc. 2009. 29 pages.
International Search Report and Written Opinion dated Nov. 26, 2021 in connection with International Application No. PCT/US2021/045330.

* cited by examiner

*Primary Examiner* — Tri M Hoang
(74) *Attorney, Agent, or Firm* — Wolf, Greenfield & Sacks, P.C.

(57) ABSTRACT

Circuitry and methods of operating the same to strobe a DQ signal with a gated DQS signal are described. Some aspects are directed to a gating scheme to selectively pass a received strobe signal such as a DQS strobe signal based on a state of a drive enable (DE) signal in a drive circuit in the ATE, such that edges generated by the drive circuit are prevented from mistakenly strobing a received data signal such as a DQ signal.

20 Claims, 4 Drawing Sheets

APPARATUS AND METHOD FOR OPERATING SOURCE SYNCHRONOUS DEVICES

BACKGROUND

Electronic components, such as semiconductor devices, circuits, and printed circuit board (PCB) assemblies, are frequently tested, during and after their manufacture, using a test system such as an automated test equipment (ATE). To perform these tests, an ATE may include instruments that generate or measure test signals such that a range of operating conditions can be tested on a particular device-under-test (DUT). An instrument, for example, may generate a pattern of digital signals to drive digital logic within a semiconductor device. An instrument may also receive digital signals from the semiconductor device to check whether the signals transmitted by the DUT are correct. For many types of DUTs, checking a signal entails determining both that the signal has an expected value and that it occurs at an expected time.

Some devices that might be tested are designed to operate as part of a system in which one or more signals act as a clock. These devices, when properly functioning, transmit or sense signals at known times relative to a change in the clock signal. These devices may be tested with ATE that generates a clock used in connection with generating signals sent to the DUT and measuring signals from the DUT. In this way, the ATE may generate and measure signals with the appropriate timing in relation to the clock.

Some devices that might be tested transmit data signals at times that are correlated to a strobe signal, which the device sending data may generate. Such a strobing scheme may be used, for example, for semiconductor memories or other high data rate applications, where differences in propagation time for data and clock signals can cause the clock signal to reach a device sufficiently before or after the data signal that an error in sensing the data signal might occur. For devices that transmit a strobe, called source synchronous devices, a data signal and a strobe signal are communicated alongside each other such that the differences in time required for the data and strobe signals to reach another device may be small, reducing the chance that the device sensing the data at a time based on the strobe signal will sense an incorrect data value.

For many source synchronous devices, data strobe lines are bidirectional, with a device sensing data from another semiconductor device using a signal on a strobe line to determine when to sense values on a data line. Conversely, the device may generate a signal on a strobe line to indicate when it is transmitting data on the data lines so that the other device has an indication of when to sense values on the data lines.

To test a source synchronous device, the ATE may couple the strobe line to a control input of a channel configured with a receiver so as to control the timing of the receiver. When strobed, the receiver may record a signal on a data line that is coupled to a data input of the receiver. The ATE may also couple a channel configured with a driver circuit to the strobe line. This driver may be controlled to transmit a signal, operating as a strobe signal, whenever another driver in the ATE is driving a data signal on the data line. The ATE may be programmed to discard any data values sense on the data line in response to a strobe signal transmitted from the ATE such that the ATE processes signals from the DUT, and ignores signals transmitted on the data line by the ATE.

SUMMARY

Aspects of the present disclosure are directed to an apparatus and methods of operating the same to selectively pass a received strobe signal such as a DQS strobe signal based on a state of a drive enable (DE) signal in a drive circuit in the ATE.

According to some embodiments, an apparatus is provided for synchronization of data received from a semiconductor device with a strobe signal. The apparatus comprises a first connection point configured to connect to a strobe signal pin of the semiconductor device; a second connection point configured to connect to a data pin of the semiconductor device; a driver circuit having an output coupled to the first connection point and a drive enable input. The driver circuit is configured to drive the output during a drive enable period based on the state of a signal at the drive enable input. The apparatus further comprises a receiver circuit having a data input and a strobe input. The data input is coupled to the second connection point and the receiver circuit is configured to receive data at the data input based on a state of a signal at the strobe input. The apparatus further comprises a gating circuit, having an input coupled to the first connection point and an output coupled to the strobe input of the receiver circuit and a control input coupled to the drive enable input. The gating circuit is configured to selectively pass a signal from its input to its output based on a state of a signal at its control input.

According to some embodiments, an A method for source synchronization with a semiconductor device is provided. The method comprises enabling a driver to drive a strobe line of the semiconductor device during a drive enable period of a drive enable signal; receiving a strobe signal from the semiconductor device on the strobe line; generating a gated strobe signal from the received strobe signal on the strobe line based on the drive enable signal; and strobing a receiver to record a received data signal on a data line of the semiconductor device based on the gated strobe signal.

According to some embodiments, a method for operating an automated testing equipment (ATE) to test a semiconductor device is provided. The ATE comprises a driver circuit having an output coupled to a strobe line of the semiconductor device, a receiver circuit, and a gating circuit having an input coupled to the strobe line. The method comprises enabling the driver circuit to drive the strobe line during a drive enable period of a drive enable signal; receiving, at the input of the gating circuit, a strobe signal from the semiconductor device; generating, with the gating circuit, a gated strobe signal based on the received strobe signal and the drive enable signal; and strobing the receiver circuit to record a data signal on a data line of the semiconductor device based on the gated strobe signal.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
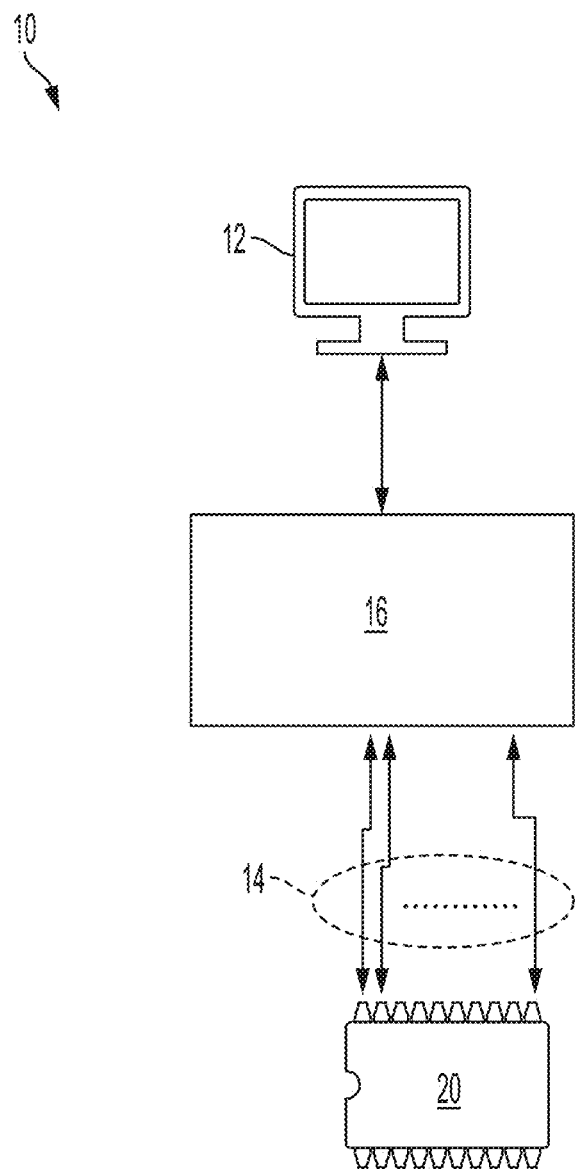
FIG. 1 is a schematic diagram of an embodiment of an automated test system in which a strobe signal is processed according to aspects of the present application for testing a source synchronous semiconductor device.

Described herein are circuits and operating methods for an ATE to accurately test source synchronous devices under test, including those operating at high speeds.

An ATE may alternate between driving data and receiving data at a data pin when testing a semiconductor device under test (DUT). For a source synchronous device under test, a strobe signal is provided by the ATE to the semiconductor device while the ATE is driving a data line connected to the DUT. In contrast, while the ATE is receiving data on the data line data from the DUT, the signal on the strobe line should be provided by the DUT. The inventors have recognized and appreciated that, in conventional test systems, the signal on the strobe line while the ATE is configured to receive data from the DUT may undesirably contain edges generated by the ATE while driving data on the data line. Impacting the signal on the strobe line in this way can interfere with the accuracy of testing on the DUT, as the ATE may sense data at times when data from the DUT is not on the data line. By sensing signals on the data line at incorrect times, the ATE may incorrectly determine that the DUT is not functioning properly.

Aspects of the present disclosure are directed to gating signals on a strobe line of a DUT based on a state of a drive enable (DE) signal in a drive circuit in the ATE used to drive the strobe line. The gated strobe signal may be provided as a strobe input to a receiver connected to the data line. The gating may selectively pass a received strobe signal such that the receiver is not inadvertently triggered to sense a signal on the data line that is not being driven by the DUT. The rising and/or falling edge of the drive enable signal may be delayed before it is used to gate the signals on the strobe line. Such techniques may be used in testing certain semiconductor memories to selectively gate signals on a DQS line to a strobe input of a receiver connected to a DQ line.

In some embodiments, an ATE includes a driver circuit, a receiver circuit, and a gating circuit. The ATE may be configured such that the driver circuit is connected to a strobe line of a DUT. The receiver circuit may be connected to a data line of the DUT. While the ATE is driving data (to the DUT) on the data line, the driver circuit may be controlled to generate a strobe signal on the strobe line to signal to the DUT when to sense data on the data line. Conversely, when the DUT is generating data to be received by the ATE, the DUT, if operating properly, may generate a strobe signal on the strobe line.

The receiver connected to the data line may be strobed by a gated strobe signal generated in the gating circuit. The gating circuit may receive a signal on the strobe line of the DUT and generate the gated strobe signal by selectively passing the received strobe signal based on a state of a drive enable (DE) signal to the driver circuit. At other times, at least during a gating duration, the gating circuit may block the received strobe signal such that it is not coupled to the strobe input of the receiver. When the received strobe signal is blocked during a gating duration, the gating circuit may set the gated strobe signal during the gating duration to a value that does not cause the receiver to sense a value on the data line, such as a logic low value, or a tri-state.

In some embodiments, the gating duration may be set to include at least a beginning period of the receive interval to block strobe signals from the driver circuit while the driver circuit is switching from an enabled state to a disabled state. The gating duration may be set to terminate at a time determined by delaying a first edge in the DE signal indicating the enabled to disabled transition. Similarly, the gating duration may be set to include at least an ending period of the receive interval to block strobe signals from the driver circuit while the driver circuit is switching from a disabled state to an enabled state. The gating duration may be set to begin at a time determined by delaying a second edge in the DE signal indicating the disabled to enabled transition.

The aspects and embodiments described above, as well as additional aspects and embodiments, are described further below. These aspects and/or embodiments may be used individually, all together, or in any combination of two or more, as the application is not limited in this respect.

FIG. 1 is a schematic diagram of an exemplary embodiment of an automated test system that may be configured to control the receipt of source synchronous data using techniques as described herein. FIG. 1 illustrates a test setup 10 that contains a test computer 12 that controls a tester 16 to perform tests on a device under test (DUT) 20 in accordance to methods disclosed in the present application. In some scenarios, the tester 16 may be an automated test equipment (ATE), including driver and receiver circuits that are constructed as is known in the art. The drivers may drive signals at their outputs while a signal connected to their drive enable inputs are asserted. The receivers may sense values of signals at their inputs in response to signals connected their strobe inputs being asserted. The function of each driver and receiver may be controlled by a test program loaded into tester 16. The test program may be written to apply test signals to DUT 20 and record a response. The recorded responses may be processed to determine whether DUT 20 is operating according to its specified designs.

The DUT 20 may be any suitable device for testing. DUT 20 may be a semiconductor device and in some embodiments may be a memory device. DUT 20 may be a random-access memory (RAM), dynamic RAM (DRAM), static RAM (SRAM), synchronous dynamic RAM (SDRAM), double data rate (DDR) SDRAM, a non-volatile memory such as an erasable programmable read-only memory (EPROM), NAND flash memory, NOR flash memory, or any other type of memory devices. It should be appreciated that DUT 20 need not be a single-purpose semiconductor device, and in some embodiments may be a package of more than one semiconductor components, such as a system-on-chip (SOC) that includes a memory device as part of the package. In embodiments as described herein, DUT 20 may be a source synchronous device, and may have data lines and an associated strobe line. One or more drivers and/or receivers of the ATE may be connected to each of the lines of the DUT for generating and measuring signals on the lines of DUT 20 during a test.

In FIG. 1, ATE 16 may contain circuitry to generate and/or measure multiple test signals 14 for DUT 20. ATE 16 may include multiple instruments configured to generate or measure different types of analog or digital signals. ATE 16 may include one or more timing generators configured to synchronize the generation of the multiple test signals within different channels. In some embodiments, ATE 16 may include a programmable delay line for delaying a signal, as described in detail below, for each of a plurality of timing signals that controls each of the plurality of test signals.

It should be appreciated that FIG. 1 is a greatly simplified representation of an automated test system. For example, though not illustrated, test system 10 may include control circuitry that controls operation of instruments within ATE 16. Additionally, test system 10 may include processing circuitry to process measurements and determine whether a DUT 20 is operating correctly. Further, though FIG. 1 illustrates a scenario in which a single DUT 20 is being tested, test system 10 may be configured to test multiple devices. Regardless of the number of instruments or other components generating or measuring test signals and the number of devices under test, test system 10 may include signal delivery components that route the signals between the DUT 20 and the instruments within ATE 16.

Further, it should be appreciated that other components as illustrated are exemplary rather than limiting. For example, although the test computer 12 is illustrated as a personal computer (PC) in FIG. 1, it should be appreciated that any suitable computing device may be used to implement a test computer, for example, a mobile device or a computer work station. Test computer 12 may be connected to a network and capable of accessing resources over the network and/or communicate with one or more other computers connected to the network.

Figure 2:
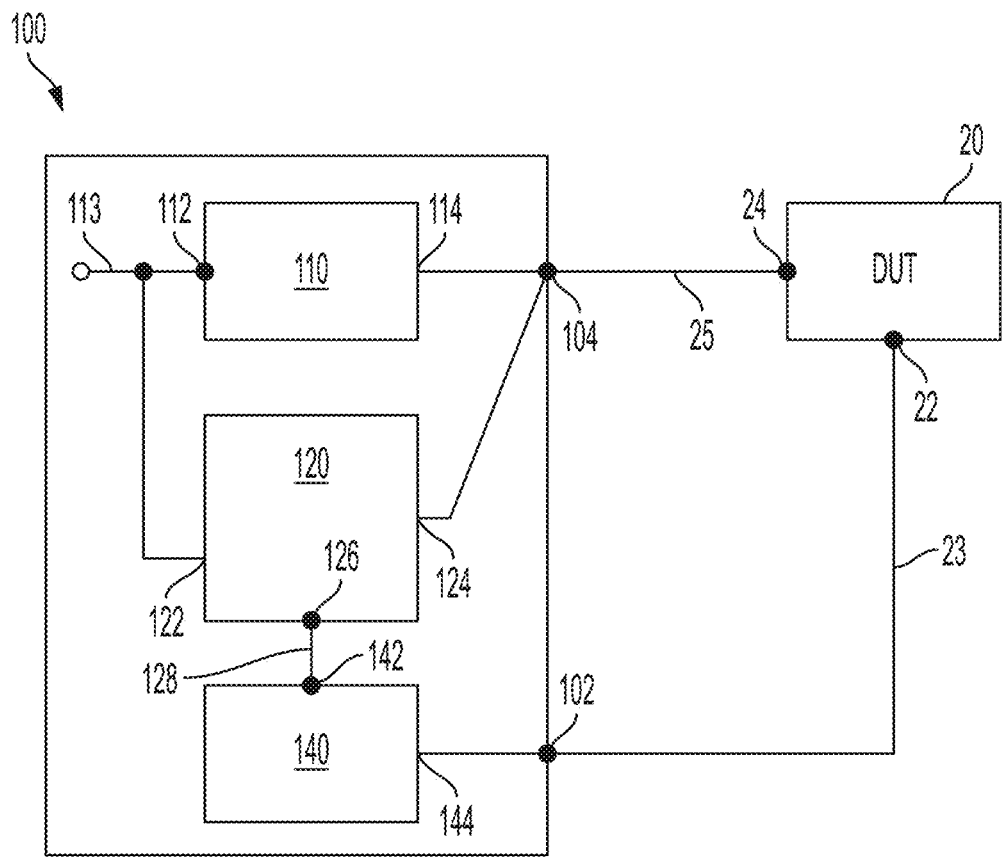
FIG. 2 is a schematic diagram illustrating an apparatus for testing a DUT, in accordance with some embodiments.

FIG. 2 is a schematic diagram illustrating an apparatus 100 for testing a DUT 20, in accordance with some embodiments. In this example, apparatus 100 may be circuitry inside ATE 16. For example, apparatus 100 may be a portion of a test instrument within an ATE, and may be implemented in the form of pin electronics (PE) and/or a timing generator. The PE may include separate components, or may be implemented as one or more integrated circuits (ICs) that comprise a large number of transistors.

DUT 20 may be a semiconductor device and has a data pin 22 and a strobe signal pin 24. In this example, pins 22 and 24 are illustrated on the periphery of DUT 20. However, pins 22 and 24 may represent any location at which a connection may be made to circuitry of DUT 20. In scenarios in which DUT 20 is a packaged part, pins 22 and 24 may be leads extending from the semiconductor device package do DUT 20. In embodiments in which DUT 20 is tested while part of a wafer, pins 22 and 24 may represent pads or test points within DUT 20 where a connection may be made to a data line and a strobe line, respectively.

FIG. 2 shows that apparatus 100 includes a driver circuit 110, a gating circuit 120 and a receiver circuit 140. Apparatus 100 has a first connection point 102 that can be connected to the data pin 22 to receive a data signal 23 from DUT 20. Apparatus 100 has a second connection point 104 that can be connected to the strobe signal pin 24 to send/receive a strobe signal 25 to/from DUT 20. Other circuitry is not shown for simplicity, but may be understood to be present based on the description herein. For example, though not shown, apparatus 100 may further include another driver that may drive data to data pin 22. That data may be timed relative to a strobe signal driven to strobe signal pin 24 by driver circuit 110.

Driver circuit 110 has an output 114 coupled to the first connection point 104. Driver circuit 110 has a drive enable input 112 that can receive a drive enable (DE) signal 113, such as may be provided by a pattern generator that executes a test program. The test pattern may specify operations and their timing during a test of DUT 20, such as driving certain data on data lines to the DUT or sensing data on certain data lines. In some embodiments, the DE signal 113 may have an enabled state and a disabled state, and driver circuit 110 may drive the strobe signal pin 24 of DUT 20 with a strobe signal 25 during a drive interval of a testing process when the DE signal is in an enabled state.

Receiver circuit 140 has a data input 144 coupled to the second connection point 102 to receive data signal 23. Receiver circuit 140 also has a strobe input 142. The signal at strobe input 142 controls when receiver circuit senses data.

Gating circuit 120 has an input 124 coupled to the first connection point 104 and an output 126 coupled to the strobe input 142 of the receiver circuit 140. Gating circuit 120 also has a control input 122 coupled to the drive enable input 112 of the driver circuit 110.

Still referring to FIG. 2, in a receive interval during an exemplary testing processing, receiver circuit 140 strobes data signal 23 received from a data line in the DUT 20 using a gated strobe signal 128 received at the strobe input 142. The gated strobe signal 128 is generated by gating circuit 120 based on the strobe signal 25 received from a strobe line of the DUT 20, and based on the DE signal 113 at the control input 122. In some embodiments, the gating circuit 120 selectively passes the received strobe signal 25 from its input 124 to its output 126 based on a state of the DE signal 113. For example, gating circuit 120 may alternatively set the gate strobe signal 128 to a logic low during a gating duration or pass the received strobe signal 25 as the gated strobe signal 128 outside of the gating duration. The gating duration may be set based on rising edges and falling edges of the DE signal 113. In some embodiments, the gating duration may start and end based on delayed rising edges and falling edges of the DE signal 113. The delay applied to the rising and falling edges may be the same or different. In some embodiments, the delay of each of the rising and falling edges may be determined using a calibration process.

In some embodiments, the gated strobe signal may be optionally and additionally delayed by an amount of time in the gating circuit, prior to being provided to the receiver circuit to adjust timing synchronization. The total delays, regardless of where applied, may be selected such that received strobe signals begin to be applied to receiver 140 at a time relative to a de-assertion of the DE signal commensurate with the time required for a signal from the ATE, indicating that the ATE is not driving data, to propagate to the DUT and for the DUT to respond by transmitting data and for that data to reach receiver 140. The delays also ensure the signal on the strobe line is not used to strobe receiver 140 after a time following the assertion of the DE signal that driver 110 could generate a signal that would then propagate to receiver 140.

Figure 3:
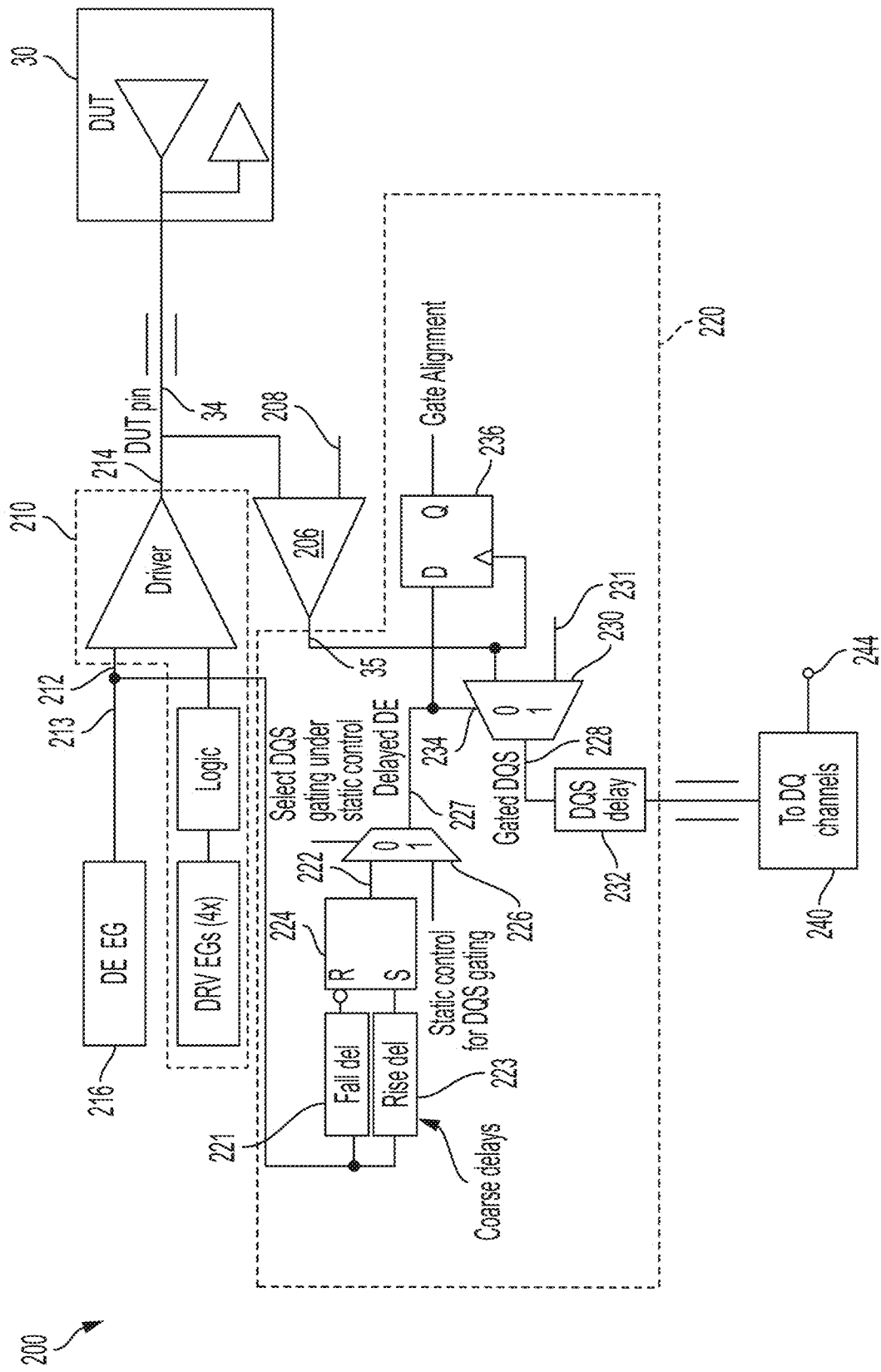
FIG. 3 is a schematic diagram illustrating an exemplary implementation of an apparatus for testing a DUT as shown in FIG. 2.

FIG. 3 is a schematic diagram illustrating an apparatus 200 for testing a DUT 30, in accordance with some embodiments. DUT 30 is similar to DUT 20 in FIG. 2 in many aspects, while apparatus 200 may be an exemplary implementation of apparatus 100 as shown in FIG. 2.

In FIG. 3, apparatus 200 includes a driver circuit 210, a gating circuit 220 and a receiving circuit 240. During a drive interval, the driver circuit 210 drives a DUT pin 34 with a driving DQS signal generated at an output 214 of the driver circuit 210. The driving DQS signal may be enabled or disabled at output 214 based on a state of the DE signal 213 coupled to the drive enable input 212. During a receive interval, a DQS signal is received from a source channel in the DUT 30 at the same DUT pin 34. DE signal 213 is generated by a DE generator 216, which may, for example, be a portion of a timing generator that executes a test pattern which specifies when the ATE including apparatus 200 is to drive data line 244.

FIG. 3 illustrates circuitry that may process a received strobe signal that is either a single-ended signal or a differential signal. In this embodiment, comparator 206 has one input coupled to DUT pin 34, and a second input 208. If DUT 30 drives DQS in single-ended mode, second input 208 of comparator 206 may be set to a fixed voltage level. If DUT 30 drives DQS in differential mode, DUT pin may be coupled to one of the differential DQS signal within DUT 30, while second input 208 of comparator 206 may be coupled to a complimentary differential DQS signal. In either case, comparator 206 may provide a DQS signal 35 at its output terminal that represents a DQS signal driven from DUT 30.

Figure 4:
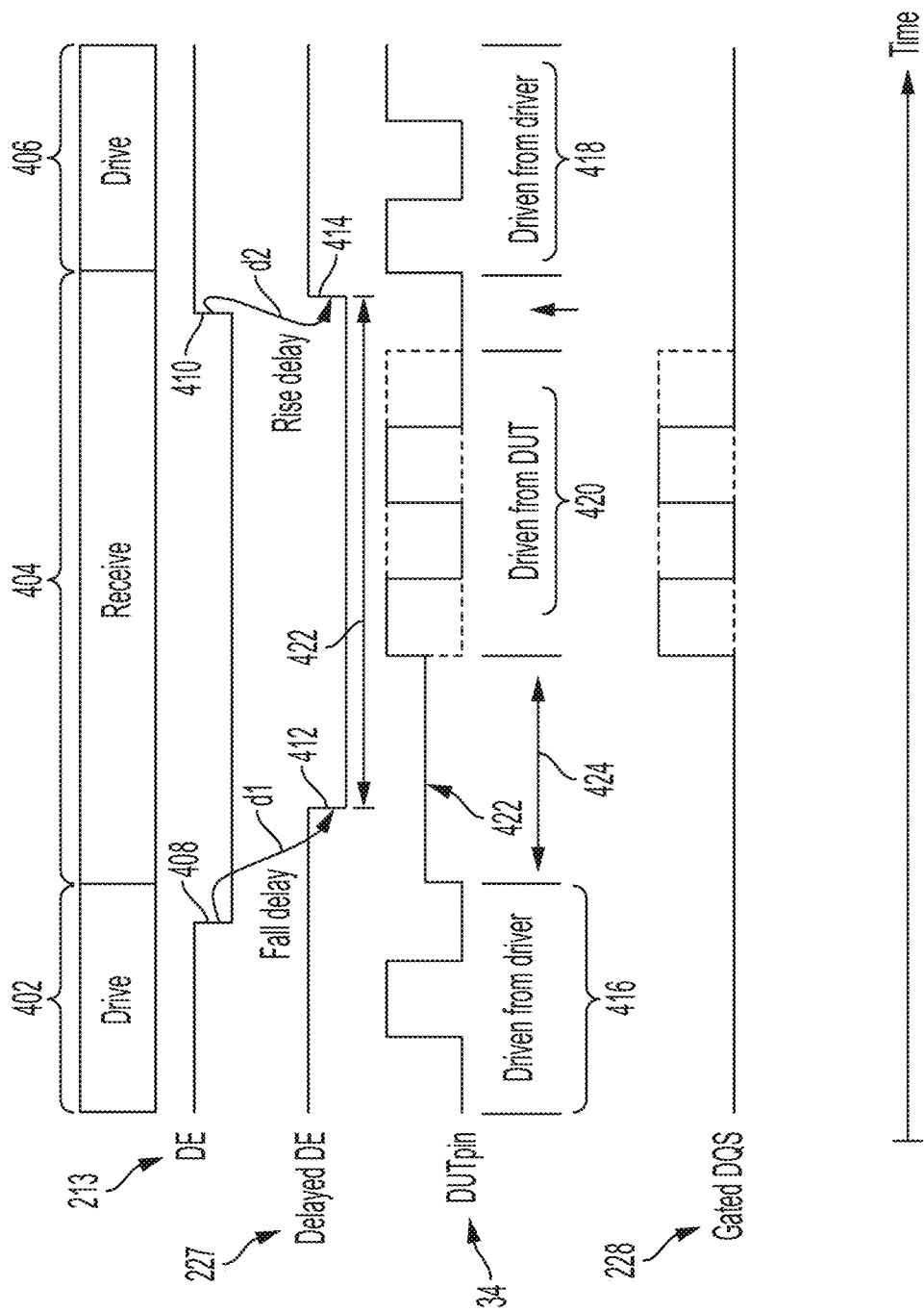
FIG. 4 shows schematic timing diagrams of several signals in the embodiment shown in FIG. 3.

The timing relationships between the DE signal 213 and signals at DUT pin 34 at various states of operation of apparatus 200 is illustrated in FIG. 4, which shows schematic timing diagrams of several signals in the embodiment shown in FIG. 3. As shown, time is divided into drive intervals and receive intervals. During drive intervals, apparatus 200 may drive data on data line 244 and may supply a strobe signal on strobe line connected to DUT pin 34. During receive intervals, apparatus 200 may sense data on data line 244 at times determined by the strobe signal on the strobe line. In the example of FIG. 4, a gated DQS signal has transitions that mirror the strobe signal driven from the DUT during the receive interval, but otherwise is in a non-inserted state.

As shown in FIG. 4, while there is a logic high in DE signal 213, the driver circuit 210 outputs a sequence of driving DQS signals 416 during a drive interval 402 at the output 214. Driving DQS signal 416 is therefore driven from the driver circuit, and is reflected in the waveform for DUT pin 34. Following a falling edge 408 in the DE signal 213, the driving DQS signal is disabled at output 214, and the waveform for DUT pin 34 shows a received DQS signal 420 that is driven from DUT 30 during a receive interval 404. Following a rising edge 410 in the DE signal 213, a new drive interval 406 commences and driving DQS signal 418 is applied at the DUT pin 34. It should be appreciated that while FIG. 4 illustrates a particular combination of falling edge/rising edge in DE signal 213 as corresponding to the drive-to-receive/receive-to-drive interval transitions, respectively, such an example is for illustrative purpose only and edges of opposing polarities to those shown in DE signal 213 in FIG. 4 may also be used.

Still referring to FIG. 4, the timing of edges in DE signal 213 determines the timing of when the driver circuit alternates between drive and receive intervals. In some embodiments, the timing of edges in DE signal 213, for example falling edge 408 may be set prior to when the generated driving DQS signal 416 from driver circuit 210 changes into a level 424, to ensure the DE edge 408 determines the driver timing and avoid glitching. When drive interval 402 terminates, the level 422 at DUT pin 34 may be set by output 214 of driver circuit 212 into a state that is not interpreted as a strobe signal by a receiver. In various embodiments, that state may be a logic low, a logic high, or a third level (tri-state level) as shown in FIG. 4. In some embodiments, level 422 may be set as a tri-state for receiving a single-ended DQS signal, in some other embodiments, level 416 may be set as logic low or high when the received DQS signal 420 are in differential configurations.

The inventors have appreciated and recognized that if signals received at DUT pin 34 are used as a DQS strobe signal during the receive interval 404 to strobe received data, edges from driving DQS signals 416 near the beginning of the receive interval 404, and edges from driving DQS signal 418 near the end of the receive interval 404 may cause errors in strobing the receive data, since there is no received data from the DUT that correspond to the DQS signal generated in the driver circuit. Aspects of the present disclosure are directed to generating a gated DQS signal such as signal 228 as shown in FIG. 4 that can block the driving DQS signals during at least the beginning and the end portions of the receive interval.

As shown in FIG. 4, gated DQS signal 228 is generated by passing through the received DQS signal 420 during a pass period 422 within the receive interval 404. Pass period 422 is defined by a first edge 412 and a second edge 414 of a delayed DE signal 227. The duration from second edge 414 to the next occurrence of the first edge 412 may therefore be a gating duration, in which the gated DQS signal 228 is set to be logic low value to avoid strobing any received data signal.

Still referring to FIG. 4. Pass period 422, and likewise the gating duration is set based on the edges 408 and 410 in the DE signal 213. In particular, first edge 412 is set by delaying edge 408 by a first amount d1, while second edge 414 is set by delaying edge 410 by a second amount d2. The delay amounts d1 and d2 may be set such that the driving DQS signal may be prevented from appearing in the gated DQS signal, while DQS edges from the DUT are not missed. The programmable delays d1 and d2 may be provided independently and separately to delay the rising edge 410 and falling edge 408 in the DE signal 213, since the delay required for disabling DQS may have different timing than for enabling DQS. For example, the round-trip signal travel time in a path between the driver circuit and the DUT may be such that there is relatively long delay 424 between the end of the driving DQS signal and the beginning of received DQS signal at the DUT pin 34. As a result, there may be relaxed requirement on the exact timing of edge 412, when the gating is turned off. On the other hand, when gating is turned on at edge 414, there is tighter requirement to set the timing because the driver circuit and comparator 206 turning on has no round trip delay. The receive to drive interval edge delay time d2 may in theory be a negative amount to begin the gating duration just prior to the driven DQS signal 418 being enabled, while in practice both d1 and d2 incorporate positive delay time amounts to account for the DQ signal travel time from the DUT to the receiver. In some embodiments, d2 may be smaller than d1 and the gating duration may be longer than a drive enable period of the DE signal.

Turning back to FIG. 3, which illustrates an exemplary implementation of a gating circuit 220 for generation of the gated DQS signal 228 as shown in FIG. 4. As shown in FIG. 3, drive enable input 212 is coupled to control input 222 of the gating circuit 220 via a pair of delay lines 221, 223, and a SR flipflop 224. An example of delay lines 221, 223 is described in U.S. Pat. No. 10,276,229, the entirely of which is incorporated by reference herein. The delay lines 221, 223 and SR flip flop 224 form a delay circuit that independently applies a delay time to falling edges and rising edges of DE signal 213. Delay line 221 is programmable to apply a delay amount d1 to the falling edge 408 of DE signal 213, while delay line 223 is programmable to apply a delay amount d2 to the rising edge 410 of DE signal 213. Each of delay lines 221, 223 may be a coarse delay line that is adjustable with an accuracy of less than 50 ps, such as between 10 and 20 ps. In some embodiments, the DQS delay d1 and d2 can be in the range of between 1 and 5 ns, such as between 1 and 2 ns. The output of delay line 221 is coupled to a R input of the SR flip flop 224. The output of delay line 223 is coupled to an S input of the SR flip flop 224. The output of the SR flip flop 224 is coupled to the control input 222 of the gating circuit 220.

The delays 221, 223 may be adjusted as part of a calibration process. For example, a calibration process may be performed by adjusting the delay times in a fall delay line 221 and a rise delay line 223 until D flip-flop 236 changes state due to the timing of delayed DE signal 227 and DQS signal 35. The calibrated delay times may determine the timing of delayed DE signal relative to DQS signal. In some embodiments, The respective delay times in delay lines 221, 223 may be separately adjusted to provide margin relative to the calibrated delay times. For example, rise delay time in delay line 223 may be adjusted so as to turn off the gated DQS signal 228 before the drive edges. Similarly fall delay times in delay line 221 may be adjusted so as to turn on the gated DQS signal 228 after the last drive edges in a burst is complete.

In FIG. 3, control input 222 carries a delayed DE signal 227 after the delayed falling edges and rising edges of DE signal 213 are combined in SR flip flop 224. Optionally and additionally, a multiplexer 226 may be coupled to the control input 222, such that the delayed DE signal 227 may be replaced by a static DQS gating control signal when DQS gating is not wished to be controlled by a delayed DE signal.

Still referring to FIG. 3, multiplexer 230 has a first selection input '0' that is coupled to a received DQS signal 35, and a second selection input '1' to a logic value 231 that may be a logic low. A multiplexer control input 234 receives the delayed DE signal 227, and controls multiplexer 230 to pass through the received DQS signal 35 to become gated DQS signal 228 at a multiplexer output when the delayed DE signal 227 is at a logic low, and to set the gated DQS signal 228 to logic level 231 when delayed DE signal 227 is at a logic high. The result of the timing relation between various waveforms is shown in FIG. 4.

Optionally and additionally, a delay may be applied to gated DQS signal 228, such as by a DQS delay unit 232, prior to using the delayed gated DQS signal to strobe DQ signal 244 received in the receiver circuit 240. In some embodiments, a D-flip flop 236 is optionally coupled to the delayed DE signal 227 and the '0' input to multiplexer 234. The D-flip flop 236 may be used for calibration purposes within the gating circuit 220. For example, the gate alignment signal at the Q output terminal of the D-flip flop 236 may provide observability to the state of the delayed DE signal 227 with respect to rising edges of the DQS signal 35.

Having thus described several aspects of at least one embodiment of this invention, it is to be appreciated that various alterations, modifications, and improvements will readily occur to those skilled in the art. For example, while only a single source channel is shown in FIG. 2 and FIG. 3, it should be appreciated that aspects of the present disclosure may be expanded to provide gated DQS signals in multiple source channels to gate multiple DQ channels based on a drive enable signal.

Moreover, for simplicity of description, one strobe line is illustrated as associated with one data line. In some scenarios, a strobe line may be associated with multiple data lines, such as multiple data lines forming a bus. In such a scenario, components that drive or receive signals on a data line may be duplicated and controlled from the same gated strobe signal.

Also for simplicity of illustration, operation of a properly functioning DUT is described. The test system may be programmed to identify that the DUT does not respond to signals in the same way as a properly functioning device and may in response provide an output indicating that the DUT malfunctioned.

As an example of a further variation, an ATE and a DUT are used as an example of two device that may communicate data using source synchronous communication. Circuitry and techniques as described herein may be used in other devices that communicate data using source synchronous communication, such as a processor that may communicate with a memory chip.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus for synchronization of data received from a semiconductor device with a strobe signal, the apparatus comprising:
   a first connection point configured to connect to a strobe signal pin of the semiconductor device;
   a second connection point configured to connect to a data pin of the semiconductor device;
   a driver circuit having an output coupled to the first connection point and a drive enable input, wherein the driver circuit is configured to drive the output during a drive enable period based on a state of a signal at the drive enable input;

a receiver circuit having a data input and a strobe input, wherein the data input is coupled to the second connection point and the receiver circuit is configured to receive data at the data input based on a state of a signal at the strobe input; and a gating circuit, having an input coupled to the first connection point and an output coupled to the strobe input of the receiver circuit and a control input coupled to the drive enable input, wherein the gating circuit is configured to selectively pass a signal from its input to its output based on a state of a signal at its control input.

2. The apparatus of claim 1, wherein the drive enable input is coupled to the control input through a delay circuit comprising a first delay component and a second delay component, wherein the first delay component is configured to delay a rising edge of the signal at the drive enable input by a first amount and the second delay component is configured to delay a falling edge of the signal at the drive enable input by a second amount.

3. The apparatus of claim 2, wherein the delay circuit further comprises:

an SR flip flop comprising an output coupled to the control input of the gating circuit and an S input coupled to the first delay component and a R input coupled to the second delay component.

4. The apparatus of claim 3, wherein the first delay component and the second delay component are independently programmable.

5. The apparatus of claim 3, wherein the gating circuit comprises:

a multiplexer comprising an output and at least a first selection input and a second selection input and a multiplexer control input; wherein:

the multiplexer is configured to selectively couple a signal from the first selection input or the second selection input to the output based on a state of a signal at the multiplexer control input, the first selection input is coupled to the first connection point; and the multiplexer control input is coupled to the output of the SR flip flop.

6. The apparatus of claim 1, wherein the gating circuit is configured to selectively pass the signal from its input to its output when the signal at its control input is in a first state and to pass a logic low value when the signal at its control input is in a second state different from the first state.

7. The apparatus of claim 1, wherein the apparatus comprises automated test equipment (ATE) comprising a plurality of channels configured to generate and/or measure signals for a device under test (DUT), and the first connection point is in a first of the plurality of channels and the second connection point is in a second of the plurality of channels.

8. The apparatus of claim 1, further comprising a second delay circuit, and the output of the gating circuit is coupled to the strobe input of the receiver circuit through the second delay circuit.

9. A method for source synchronization with a semiconductor device, comprising:

enabling a driver to drive a strobe line of the semiconductor device during a drive enable period of a drive enable signal;

receiving a strobe signal from the semiconductor device on the strobe line;

generating a gated strobe signal from the received strobe signal on the strobe line based on the drive enable signal; and strobing a receiver to record a received data signal on a data line of the semiconductor device based on the gated strobe signal.

10. The method of claim 9, wherein generating the gated strobe signal from the received strobe signal on the strobe line comprises alternatively passing the received strobe signal as the gated strobe signal or setting the gated strobe signal to a logic low value based on the drive enable signal.

11. The method of claim 9, wherein generating the gated strobe signal from the received strobe signal on the strobe line comprises passing the received strobe signal as the gated strobe signal or blocking the received strobe signal during a gating duration, wherein the drive enable period is defined by a first edge and a second edge in the drive enable signal, and wherein:

generating the gated strobe signal further comprises:

commencing the gating duration at a delayed first edge based on a timing of the first edge in the drive enable signal; and terminating the gating duration at a delayed second edge based on a timing of the second edge in the drive enable signal.

12. The method of claim 11, wherein the gating duration is longer than the drive enable period.

13. The method of claim 11, further comprising:

with a first delay component, delaying the first edge of the drive enable signal by a first delay amount to become the delayed first edge; and with a second delay component, delaying the second edge of the drive enable signal by a second delay amount different from the first delay amount to become the delayed second edge.

14. The method of claim 9, wherein the strobe signal is a DQS signal and wherein the received data signal is a DQ signal.

15. The method of claim 9, wherein strobing the receiver comprises:

applying a delay to the gated strobe signal to generate a delayed gated strobe signal; and strobing the receiver based on the delayed gated strobe signal.

16. A method for operating an automated testing equipment (ATE) to test a semiconductor device, the ATE comprising a driver circuit having an output coupled to a strobe line of the semiconductor device, a receiver circuit, and a gating circuit having an input coupled to the strobe line, the method comprising:

enabling the driver circuit to drive the strobe line during a drive enable period of a drive enable signal;

receiving, at the input of the gating circuit, a strobe signal from the semiconductor device;

generating, with the gating circuit, a gated strobe signal based on the received strobe signal and the drive enable signal; and strobing the receiver circuit to record a data signal on a data line of the semiconductor device based on the gated strobe signal.

17. The method of claim 16, wherein generating the gated strobe signal comprises alternatively passing the received strobe signal as the gated strobe signal or setting the gated strobe signal to a logic low value based on the drive enable signal.

18. The method of claim 16, wherein generating the gated strobe signal from the received strobe signal on the strobe line comprises passing the received strobe signal as the gated strobe signal or blocking the received strobe signal during a gating duration, wherein the drive enable period is defined by a first edge and a second edge in the drive enable signal, and wherein:

generating the gated strobe signal further comprises:
commencing the gating duration at a delayed first edge based on a timing of the first edge in the drive enable signal; and
terminating the gating duration at a delayed second edge based on a timing of the second edge in the drive enable signal.

19. The method of claim 18, wherein the gating duration is longer than the drive enable period.

20. The method of claim 18, wherein the gating circuit comprises a first delay line and a second delay line, and the method further comprising:
with the first delay line, delaying the first edge of the drive enable signal by a first delay amount to become the delayed first edge; and
with the second delay line, delaying the second edge of the drive enable signal by a second delay amount different from the first delay amount to become the delayed second edge.

* * * * *